United States Patent
Mistry et al.

(10) Patent No.: US 6,429,531 B1
(45) Date of Patent: Aug. 6, 2002

(54) METHOD AND APPARATUS FOR MANUFACTURING AN INTERCONNECT STRUCTURE

(75) Inventors: Addi B. Mistry; Rina Chowdhury; Scott K. Pozder; Deborah A. Hagen; Rebecca G. Cole; Kartik Ananthanarayanan, all of Austin, TX (US); George F. Carney, Mesa, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/551,312

(22) Filed: Apr. 18, 2000

(51) Int. Cl.[7] .................. H01L 23/48; H01L 23/52; H01L 29/40
(52) U.S. Cl. ............... 257/780; 257/781; 257/784
(58) Field of Search ................ 257/780, 781, 257/784, 751, 767

(56) References Cited

U.S. PATENT DOCUMENTS

| | | | |
|---|---|---|---|
| 5,071,518 A | | 12/1991 | Pan |
| 5,447,264 A | * | 9/1995 | Koopman et al. |
| 5,461,261 A | * | 10/1995 | Nishiguchi |
| 5,600,180 A | * | 2/1997 | Kusada et al. |
| 5,872,404 A | | 2/1999 | Lynch et al. ............ 257/781 |
| 5,943,597 A | * | 8/1999 | Kleffner et al. |
| 5,977,632 A | * | 11/1999 | Beddingfield |
| 6,180,505 B1 | | 1/2001 | Uzoh |
| 6,198,169 B1 | * | 3/2001 | Kobayashi et al. |
| 6,287,893 B1 | * | 9/2001 | Elenius et al. |

FOREIGN PATENT DOCUMENTS

| | | |
|---|---|---|
| DE | 19616373 A1 | 8/1997 |
| DE | 19907525 A1 | 9/1999 |
| JP | 2000091341 | 3/2000 |
| JP | 2000091369 | 3/2000 |
| JP | 20000228006 | 8/2000 |

OTHER PUBLICATIONS

Lee et al., "Development and Characterization of an Alpha Particle Low Emissivity Measurement System for Semiconductor Industry," Motorola, Inc. (6 pgs.), to be published in IMAPs Apr. 2000.

* cited by examiner

Primary Examiner—Sheila V. Clark

(57) ABSTRACT

An interconnect structure, such as a flip-chip structure, including a base pad and a stud formed on the base pad and extending from the base pad is disclosed. The stud and base pad are formed to be continuous and of substantially the same electrically conductive base material. Typically, a solder structure is formed on the stud wherein the solder structure is exposed for subsequent reflow attachment to another structure. The present invention relates to packaging integrated circuits, more particularly to the structure and processing of a stud and bump without the standard under bump metallurgy.

11 Claims, 5 Drawing Sheets

METHOD AND APPARATUS FOR MANUFACTURING AN INTERCONNECT STRUCTURE

FIELD OF THE INVENTION

The present invention relates to packaging integrated circuits, more particularly to the structure and processing of a stud and bump without the standard under bump metallurgy.

BACKGROUND OF THE INVENTION

This invention involves the process and structure of forming an interconnect structure including a stud and a bump on an integrated circuit chip. Currently, in the semiconductor industry, an under bump metal (UBM) is applied on top of a base pad, where the base pad is typically aluminum or copper or their alloys. The UBM usually consists of a layer of chrome, a layer of chrome copper (CrCu), a layer of copper (Cu), and a layer of gold (Au) below an evaporative bump stud. For an electroplated bump, the UBM typically consists of a layer of titanium tungsten nitride (TiWNx), a layer of titanium tungsten (TiW) and a layer of copper below the stud. This under bump metallurgy is used as a solder diffusion barrier for obtaining good adhesion and for reducing stresses between the base pad and the stud.

The present invention provides an interconnect structure without the need for a UBM, thereby reducing process steps, manufacturing cost and increasing reliability. In the present invention, a stud is applied directly to the base pad using substantially the same base material. The advantages of this invention include the use of substantially the same base material for the stud and for the bond pad which decreases stress, reduces processing steps and cost, without creating an adhesion problem between the stud and base pad.

BRIEF DESCRIPTION OF THE FIGURES

The present invention is illustrated by way of example and not limitation in the accompanying Figures, in which like references indicate similar elements, and in which.

Skilled artisans appreciate that elements in the Figures are illustrated for simplicity and clarity and have not necessarily been drawn to scale. For example, the dimensions of some of the elements in the Figures may be exaggerated relative to other elements to help improve the understanding of the embodiments of the present invention.

DETAILED DESCRIPTION OF THE DRAWINGS

Figure 1:
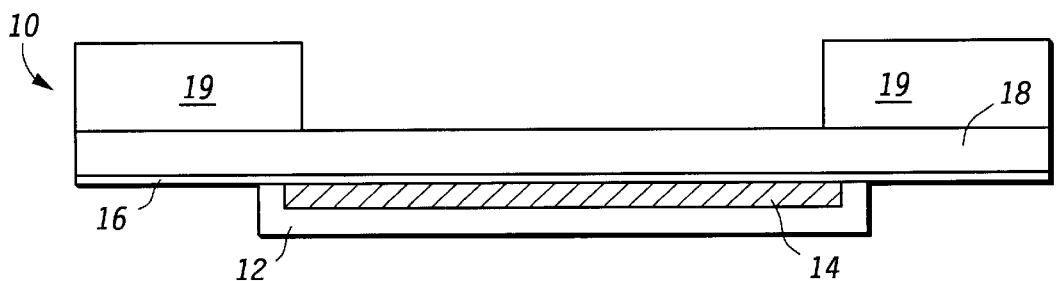
FIGS. 1–3 show cross-sectioned views of successive process steps for formation of the interconnect structure.

FIG. 1 shows an interconnect structure 10 including a barrier layer 12, for example tantalum, underneath a base pad 14. Other metals such as tantalum nitride, tungsten, tungsten nitride, titanium silicon nitride, tantalum silicon nitride, nickel and the like, can be used as a barrier material. The barrier layer 12 is used to prevent diffusion of the base pad 14 material within a substrate (not shown). Preferably, the electrically conductive base material of the base pad 14 is a copper. However, the base material of the base pad 14 may also be, for example, copper alloys, nickel vanadium, or any material where the base material is a conductive metal and does not react aggressively with a solder material to create an undesirable effect. For example, tin from the solder can react with the base material of the base pad 14 such as copper to form a metallic and brittle tin/copper compound. As long as the tin is not starved of copper and there is sufficient copper, the material can be used. The base material is defined as being the majority of the material, which forms the base pad 14. For example, a copper alloy would have the majority of the base material as copper including some additional dopant elements.

Figure 2:
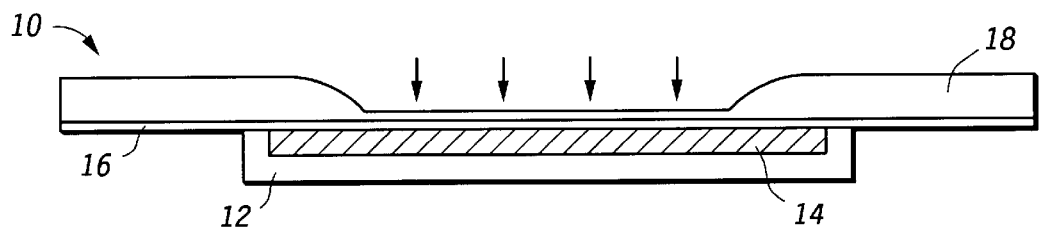

Over the base pad 14 there is a dielectric barrier-seed layer or etch-stop layer 16, which for example is approximately 50 nanometers layer of plasma enhanced nitride (PEN) layer. Over the etch-stop layer 16 is a passivation layer 18, for example, a layer of siliconoxynitride (SiON) having a thickness of approximately 450 nanometers. The interconnect structure typically includes a plurality of bond pads 14 or base pads on a chip separated by a dielectric material (not shown), such as tetraethylorthosilicate (TEOS or $Si(OC_2H_5)_4$). The dielectric material may also be flourine-doped TEOS (FTEOS) or any low dielectric constant material (i.e. porous oxide). The structure 10 is patterned with a photoresist 19 and the passivation layer 18 over the base pad 14 is etched such that the remaining thickness of the passivation layer 18 over an area of the base pad 14 is, for example, approximately 50 nanometers. The etch chemistry used may result in vertical edges of the passivation layer or in the sloped edges of the passivation layer 18, as shown in FIG. 2.

Figure 3:
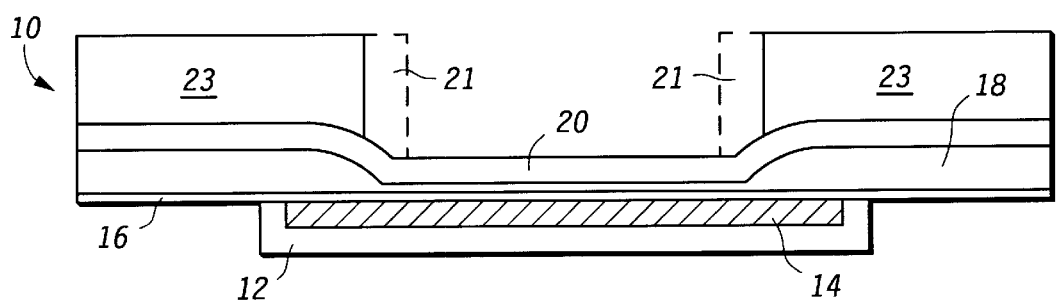
Figure 4A:
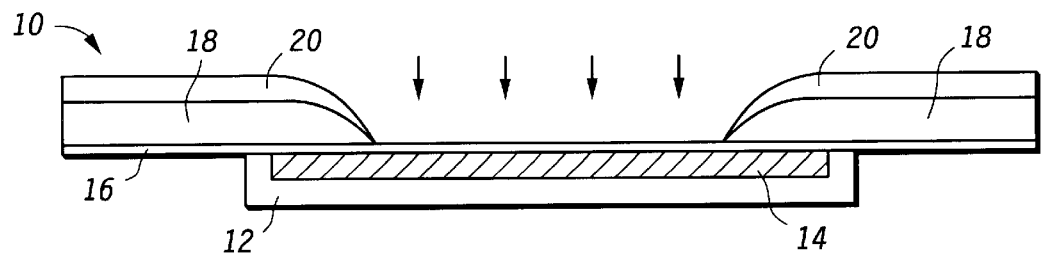
FIGS. 4A–5 show cross-sectional view of successive process steps including etching the interconnect structure as in accordance with the present invention.
Figure 4B:
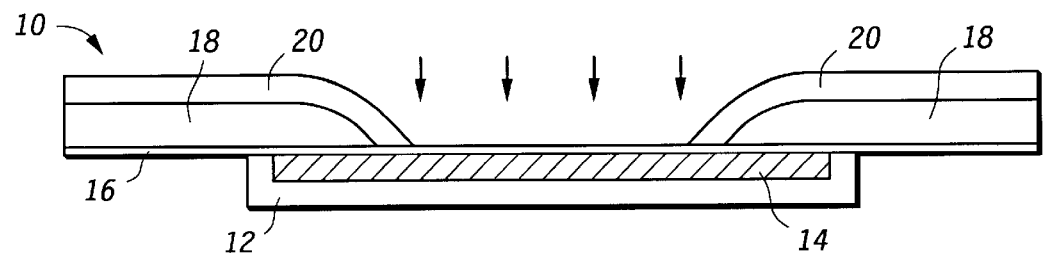

A resilient layer 20, for example a polyimide, is deposited on top of the passivation layer as shown in FIG. 3 and a second photoresist layer 23 is deposited and patterned. As a part of the photoresist patterning process, the polyimide is also patterned. A photoresist strip test follows, leaving the polyimide as the etch mask for any further passivation etching. The resilient layer 20 and passivation layer 18 are etched simultaneously using a standard etch process. Etching can result in one of two embodiments illustrated in FIGS. 4A and 4B. If a photoresist pattern illustrate by photoresist layer 23 is used, the edges of the resilient layer 20 and the passivation layer 18 will terminate at approximately the same point, called edge-to-edge coverage, as shown in FIG. 4A. By using a photoresist pattern illustrated by photoresist layer 21 having a narrower opening, the edge of the passivation layer 18 is covered by the resilient layer 20, as shown in FIG. 4B. In both FIG. 4A and FIG. 4B, the edge profile of the resilient layer 20 and passivation layer 18 are shown as sloped. The curved edge profile of the resilient layer 20 and passivation layer 18 depends indirectly on the etch chemistry used during the etching processing step illustrated in FIG. 2 and directly on the chemistry used during the etching processing step illustrated in FIGS. 4A and 4B. The etch chemistry used in etching the passivation layer 18 in FIG. 2 determines the profile of the resilient layer 20 during deposition of the resilient layer 20 shown in FIG. 3. The advantage of this edge profile is that the sloped walls decrease the amount of contaminants that can be trapped at the edges. The edge profile of the resilient layer 20 and the passivation layer 18 may, alternatively, be approximately perpendicular. However, the number of contaminants trapped at the edges increases.

Figure 5:
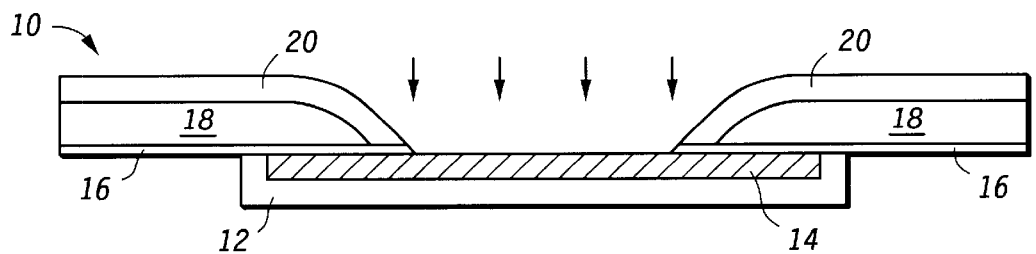

After the etch of the resilient layer 20 and the passivation layer 18, the etch-stop layer 16 is etched as shown in FIG. 5, defining an opening on the base pad 14. In the embodiment illustrated in FIG. 5, the resilient layer 20 and the passivation layer 18 are used as a mask. Afterwards an RF preclean is performed to remove the native metal oxide layer that has grown on the bond pad 14 during and after the processing steps shown in FIGS. 4A–4B. The thickness of this oxide layer is, for example, approximately 10 nanometers.

Figure 6:
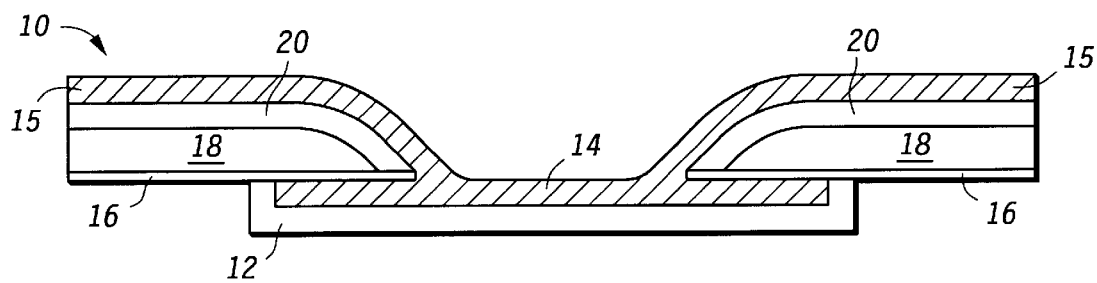
FIGS. 6–8 show cross-sectional views of successive process steps for formation of the stud in accordance with the present invention.

Without breaking vacuum, a seed layer 15 is sputtered onto the wafer 10 as illustrated in FIG. 6. The seed layer 15 is of a material that is substantially the same as the electrically conductive base material of the base pad14. For example, as the base pad 14 has been shown as formed of a copper base material, the seed layer 15 is also a copper base material. As described for the base pad 14, other materials such as copper alloys, nickel vanadium, or any material where the base material is a conductive metal and does not react with the solder material to create an undesirable effect may be used for the seed layer 15 as long as the material is substantially the same as the base pad 14 base material. The thickness of this sputtered seed layer 15 is, for example, less than 100 nanometers. A thinner sputtered seed layer 15 provides an advantage by allowing for more efficient etching of the thinner seed layer 15 during later processing steps. The sputtered seed layer 15 serves as an electrical continuity and adhesive layer for the wafer substrate in the embodiment of the present invention.

Figure 7:
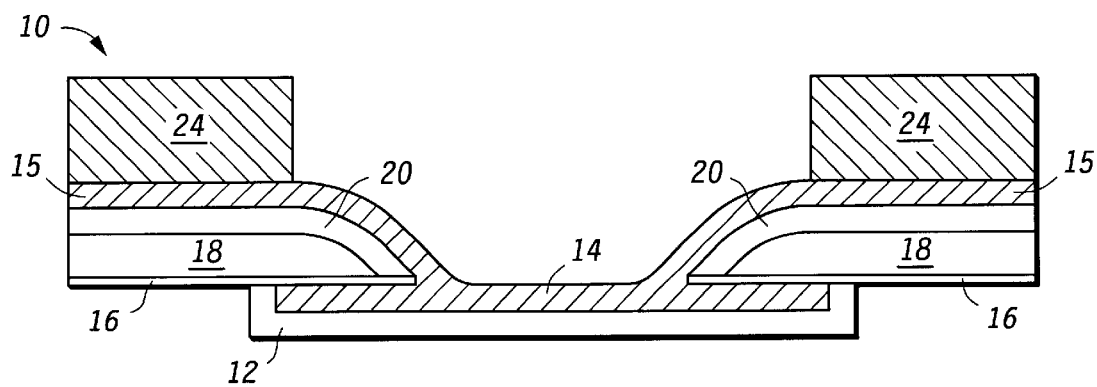
Figure 8:
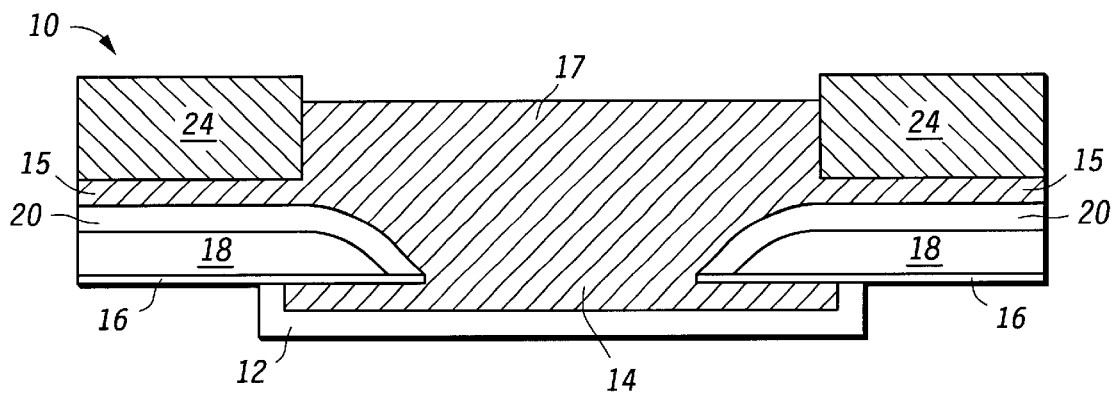

In FIG. 7, a photoresist layer 24 is formed. FIG. 8 illustrates the formation of a stud 17 formed to be continuous with the base pad 14 and of substantially the same electronically conductive base material as the base pad 14. The stud 17 is formed through the opening over the base pad 14, for example, by electroplating, evaporation or sputtering. Preferably, the electrically conductive base material of the stud 17 is a copper as the base pad 14 has been shown as formed of a copper base material. However, the base material of the stud 17 may also be, for example, copper alloys, nickel vanadium, or any material where the base material is a conductive metal, does not react with a solder material to create an undesirable effect, and as long as the material is substantially the same as the base pad 14 base material. The top surface of the stud 17 is illustrated at a height lower than the top surface height of the photoresist layer 24. The thickness of the stud 17 is preferably large enough not to be entirely consumed by the solder material over the course of the life of the device. For example, for personal communication products the stud 17 is greater than approximately 5 microns.

Figure 9:
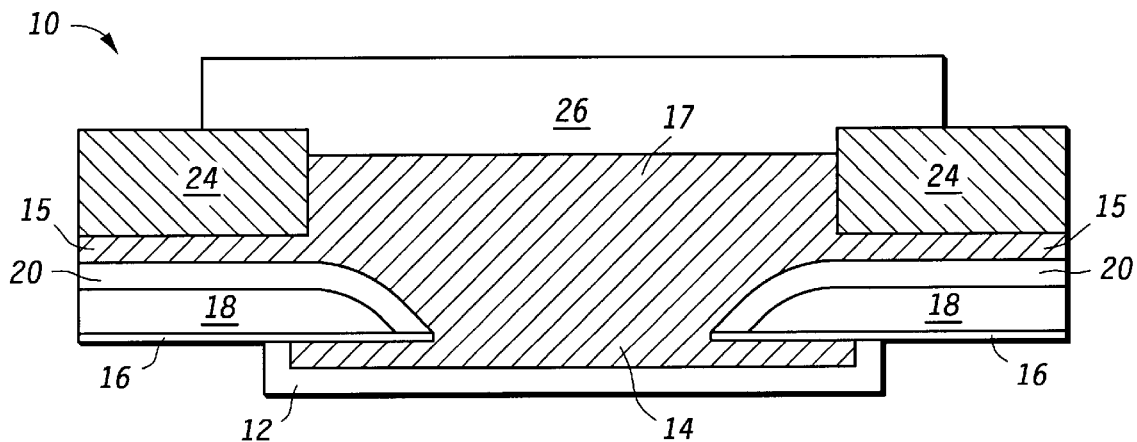
FIGS. 9–11 show cross-sectional views of successive process steps for formation of a solder structure in accordance with the present invention.
Figure 10:
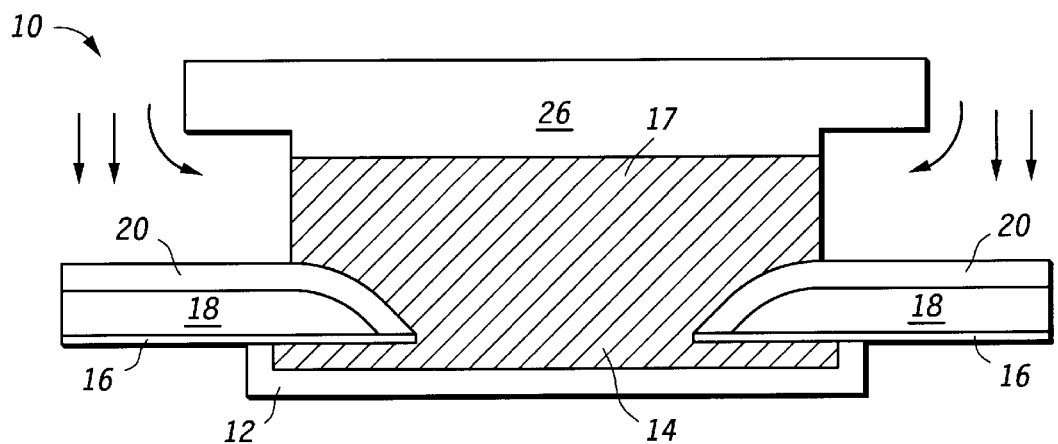
Figure 11:
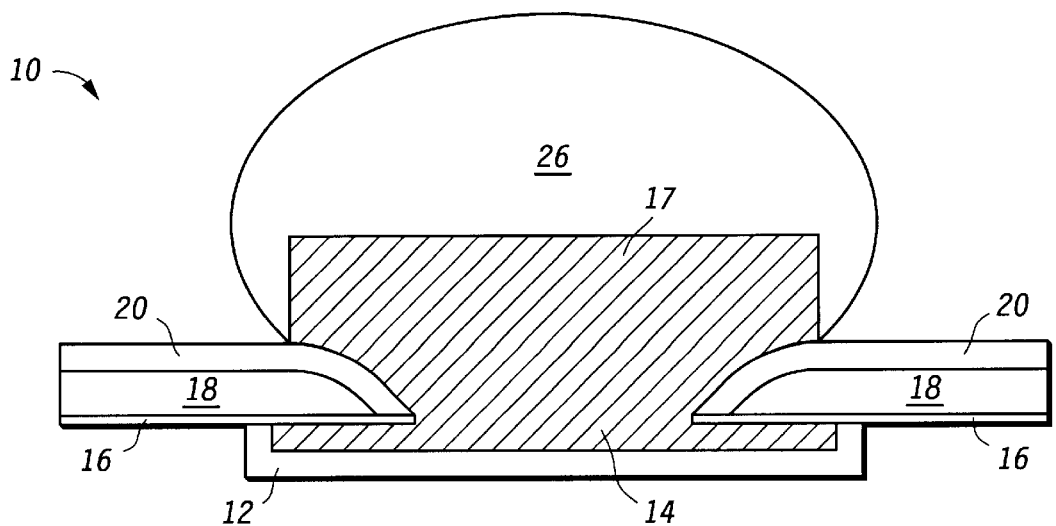

In FIG. 9, a solder layer 26 is electroplated or evaporated over the stud 17. Typically, the materials used are a high lead/tin, meaning greater than 90 weight percent lead and ten weight percent tin, eutectic lead/tin, which is a 63 weight percent lead and 37 weight percent tin. Other possible solders are no lead or environmentally friendly solders which are tin silver, tin silver copper, tin silver bismuth, and the like. In FIG. 10, the photoresist layer 24 is removed and the seed layer 15 is removed using standard etch processes. The solder layer 26 is reflowed in FIG. 11 using a temperature profile suitable to the solder material used and the solder structure is exposed for subsequent reflow attachment. A bump or a sphere around the stud 17 is typically formed by the reflow process. The structure illustrated in FIG. 11 is used, in one embodiment, as a controlled collapsible chip connection, the electrical connection between the die and the substrate, on a flip-chip structure comprising an electronic device within a semiconductor substrate.

Figure 12:
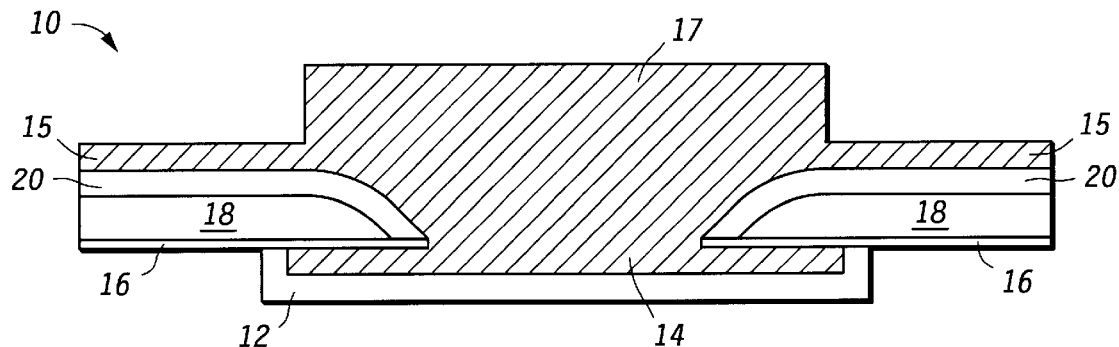
FIGS. 12–13 show cross-sectional views of successive process steps for further formation of the stud for use without a solder structure in accordance with the present invention.
Figure 13:
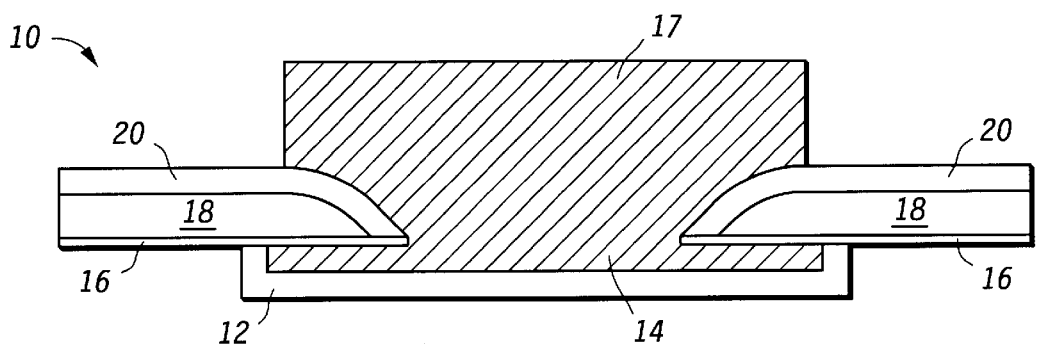

In another embodiment of the present invention, the solder layer 26 is not formed and the stud 17 is exposed for subsequent attachment to another structure. Thus, after the processing step of FIG. 8, the photoresist layer 24 is removed using standard etch processes, as shown in FIG. 12. The seed layer 15 is etched using standard processes to form the stud 17, as illustrated in FIG. 13. During the etching of the seed layer 15, a portion of the stud 17 will also be etched. However, the amount is either insignificant or the amount of material in forming for the stud 17 compensates for the portion of the stud 17 material that is etched when etching the seed layer 17.

Figure 14:
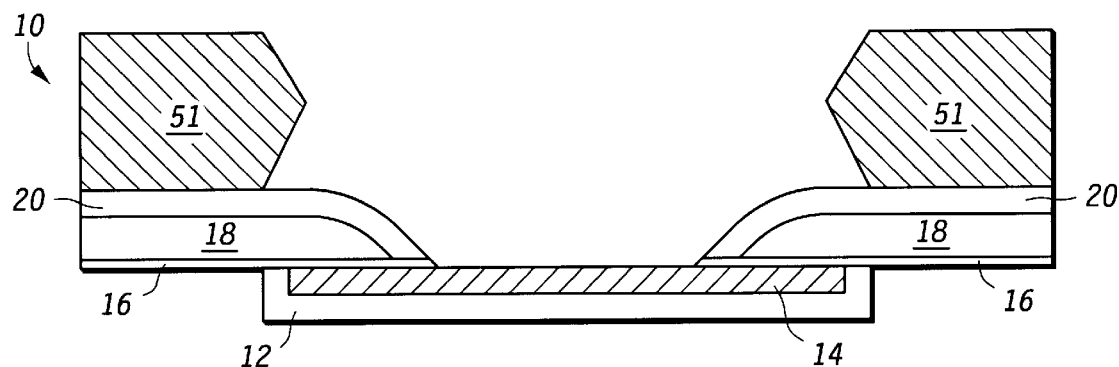
FIGS. 14–16 show cross-sectional views of successive process steps for formation of a stud and a solder structure in accordance with another embodiment of the present invention.
Figure 15:
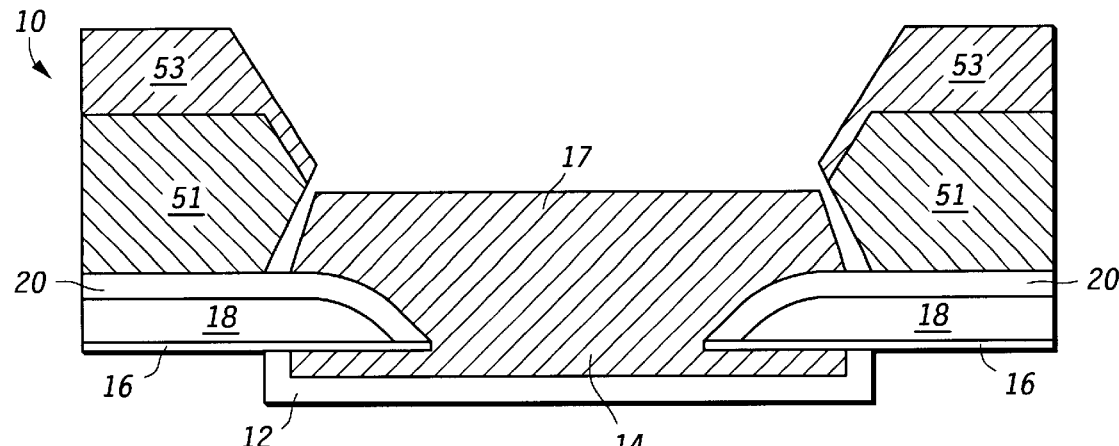
Figure 16:
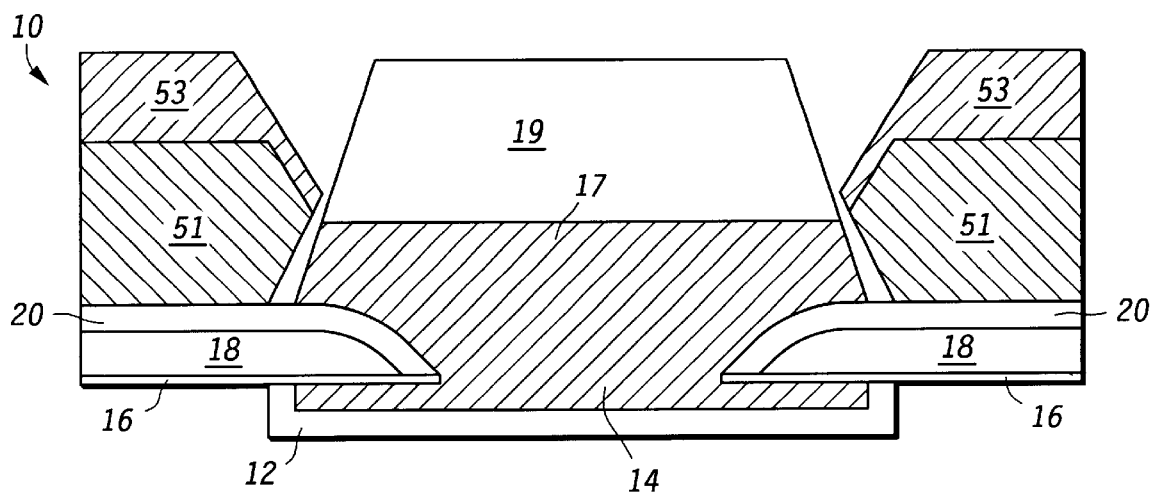

FIGS. 14–16 particularly illustrate formation of the stud 17 by evaporation. For example, after the etching process step of FIG. 5, a mask 51, such as Molybdenum, is placed above the resilient layer 20. FIG. 15 illustrates the formation of the stud 17 by evaporation to the desired thickness, wherein the base material of the stud 17 is substantially the same as the base pad 14 base material. During the evaporation process to form the stud 17, an evaporated layer 53 of the base material may also be formed over the mask 5 1, which is subsequently removed. If desired, a solder layer 19 is formed by evaporating lead/tin on stud 17 as shown in FIG. 16. The mask 51 is removed and the solder layer 19 may be reflowed for subsequent attachment to another structure. In the embodiment shown in FIGS. 14–16, the seed layer 15 is unnecessary, as no electric bus is required for the stud and solder layers.

Figure 17A:
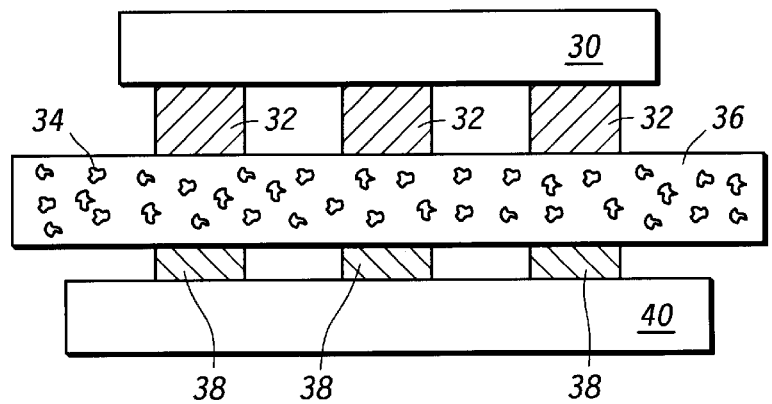
FIGS. 17A and 17B show a cross-sectional view of an application of the present invention in accordance with the present invention.
Figure 17B:
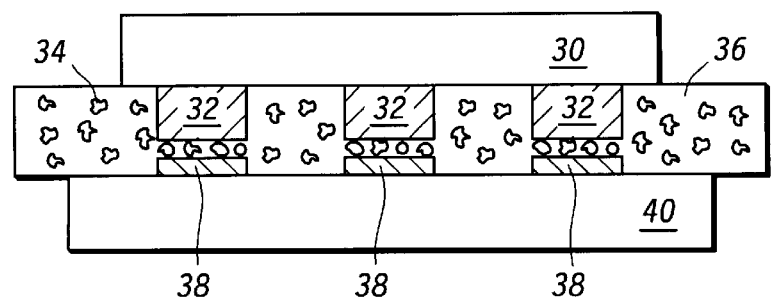

FIGS. 17A–17B illustrate an application wherein the stud 17 (without a solder layer or solder structure) is subsequently attached to another structure. A semiconductor substrate 30 including an electronic device formed thereon, for example, a flip chip die, includes a plurality of interconnect structures 32 in accordance with the present invention, electrically connected to the semiconductor substrate 30. The plurality of interconnect structures 32 are connected to a plurality of conductive pads 38 on a test board 40 using a material consisting of an insulating matrix 36 having conductive fillers 34. When heat and pressure are applied, the conductive fillers 34 electrically connect the plurality of interconnect structures 32 to the plurality of conductive pads 38 on the test board 40 by aligning between the plurality of interconnect structures 32 and conductive pads 38 as shown in FIG. 17B.

Further processing steps in the manufacturing and packaging of interconnect structures of flip-chip structures typically include applying heat for reflow attachment of solder structure or bumps, forming appropriate interconnects between a base pad and electronic devices of a semiconductor structure, and bonding or attachment of studs to a board or semiconductor structure. These further processing steps are conventional and need not be repeated herein. Likewise, the principal processing steps disclosed herein may be combined with other steps readily apparent to those skilled in the art. Although only a single stud and bump has been shown for purposes of illustration, it is understood that in actual practice, multiple studs and bumps are fabricated on a single interconnect structure as widely practiced in the art.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A flip-chip structure comprising;
   a semiconductor substrate including an electronic device formed thereon;
   a base pad on the semiconductor substrate and electrically connected to the electronic device;
   a barrier layer between the base pad and the semiconductor substrate; and
   a stud formed on the base pad and extending from the base pad wherein the stud and base pad are formed to be continuous and of substantially the same electrically conductive base material.

2. The flip-chip structure of claim 1, further comprising:
   a passivation layer on the semiconductor substrate wherein the passivation layer defines an opening over the base pad through which the stud is formed.

3. The flip-chip structure of claim 2, wherein the passivation layer includes edges defining said opening and wherein the passivation layer and the edges are covered by a resilient layer.

4. The flip-chip structure of claim 3, wherein the resilient layer is comprised of a polyimide.

5. The flip-chip structure of claim 1, wherein the stud is exposed for subsequent attachment to another structure.

6. The flip-chip structure of claim 1, further comprising:
   a solder structure formed on the stud wherein said solder structure is exposed for subsequent reflow attachment to another structure.

7. The flip-chip structure of claim 6, wherein the solder structure is formed of an electrically conductive material selected from a group consisting of lead, tin, tin and lead, tin and silver, and tin, silver and copper.

8. The flip-chip structure of claim 1, wherein the electrically conductive base material is a metal.

9. The flip-chip structure of claim 7, wherein the metal is selected from a group consisting of copper, nickel and nickel vanadium.

10. A flip-chip structure comprising;
    a semiconductor substrate including an electronic device formed thereon;
    a base pad on the semiconductor substrate and electrically connected to the electronic device;
    a barrier layer between the base pad and the semiconductor substrate;
    a passivation layer on the semiconductor substrate wherein the passivation layer includes edges defining an opening over the base pad, and wherein the passivation layer and the edges are covered by a resilient layer;
    a stud formed on the base pad through the opening and extending from the pad base wherein the stud and base pad are formed to be continuous and of substantially the same electrically conductive base material.

11. The flip-chip structure of claim 10, further comprising:
    a solder structure formed on the stud wherein said solder structure is exposed for subsequent reflow attachment.

* * * * *